United States Patent
Lee et al.

(10) Patent No.: US 12,426,213 B2
(45) Date of Patent: Sep. 23, 2025

(54) SERVER ASSEMBLY WITH CLOSED CONDENSING CIRCUIT AND COOLING APPARATUS CONTAINING THE SAME

(71) Applicants: Fang-Shou Lee, Taoyuan (TW); Cho-Han Lee, Taoyuan (TW)

(72) Inventors: Fang-Shou Lee, Taoyuan (TW); Cho-Han Lee, Taoyuan (TW); Fang Wang, Livermore, CA (US)

( * ) Notice: Subject to any disclaimer, the term of this patent is extended or adjusted under 35 U.S.C. 154(b) by 209 days.

(21) Appl. No.: 18/373,238

(22) Filed: Sep. 26, 2023

(65) Prior Publication Data

US 2025/0107049 A1    Mar. 27, 2025

(51) Int. Cl.
    *H05K 7/20* (2006.01)

(52) U.S. Cl.
    CPC ......... *H05K 7/20809* (2013.01); *H05K 7/203* (2013.01); *H05K 7/20318* (2013.01)

(58) Field of Classification Search
    CPC .............. H05K 7/203; H05K 7/20327; H05K 7/20809; G06F 2200/201
    USPC ................................................... 361/679.53
    See application file for complete search history.

(56) References Cited

U.S. PATENT DOCUMENTS

| | | | | |
|---|---|---|---|---|
| 3,858,090 A | * | 12/1974 | Lehmann | H05K 7/20236 361/689 |
| 4,027,728 A | * | 6/1977 | Kobayashi | F28D 15/0266 174/15.1 |
| 4,619,316 A | * | 10/1986 | Nakayama | F28F 13/187 257/713 |
| 4,949,164 A | * | 8/1990 | Ohashi | H01L 23/427 165/80.4 |
| 5,297,621 A | * | 3/1994 | Taraci | H05K 7/203 324/750.08 |
| 8,953,317 B2 | | 2/2015 | Campbell et al. | |
| 9,328,964 B2 | * | 5/2016 | Shelnutt | H05K 7/20318 |
| 9,464,854 B2 | * | 10/2016 | Shelnutt | H05K 7/20236 |
| 9,844,166 B2 | | 12/2017 | Shelnutt et al. | |
| 10,143,113 B2 | * | 11/2018 | Shelnutt | G06F 1/20 |
| 10,401,924 B2 | * | 9/2019 | Saito | B66D 3/26 |
| 10,416,736 B2 | * | 9/2019 | Dupont | H05K 7/20936 |
| 10,512,192 B2 | | 12/2019 | Miyoshi | |
| 10,645,841 B1 | * | 5/2020 | Mao | H05K 7/20781 |

(Continued)

FOREIGN PATENT DOCUMENTS

| CN | 204272576 U | 4/2015 |
|---|---|---|
| CN | 107045380 A | 8/2017 |

(Continued)

*Primary Examiner* — Anatoly Vortman

(57) ABSTRACT

The present invention discloses a server assembly with a closed condensing circuit, which is particularly applied in a two-phase liquid immersion cooling apparatus. The server assembly comprises a fluid-tight chassis, a server, and a condensing device. A working fluid is maintained within the chassis. The server is at least partially submerged within the working fluid. The condensing device comprising a casing and a plurality of condensing pipes is disposed above the chassis and fixed thereto. When the server starts operating, a large amount of heat is dissipated. A coolant is vaporized into a rising coolant vapor by absorbing heat dissipated from the server. Upon contact with the condensing device, the coolant vapor is condensed back into a cooling liquid that is returned to the coolant-containing chassis, thereby completely condensing all the coolant vapor.

10 Claims, 7 Drawing Sheets

(56) References Cited

U.S. PATENT DOCUMENTS

| | | | |
|---|---|---|---|
| 10,782,751 B1* | 9/2020 | Gauthier | F24D 17/0042 |
| 11,076,508 B2* | 7/2021 | Gao | H05K 7/20818 |
| 11,153,989 B2* | 10/2021 | Onodera | H05K 7/20236 |
| 11,357,137 B2 | 6/2022 | Lee | |
| 11,375,638 B2 | 6/2022 | Cheng et al. | |
| 11,589,483 B1* | 2/2023 | Lee | H05K 7/20318 |
| 11,744,043 B2* | 8/2023 | Gao | H05K 7/203 |
| | | | 361/679.53 |
| 11,839,053 B2* | 12/2023 | Wu | H05K 7/20318 |
| 12,075,599 B2* | 8/2024 | Lin | H05K 7/20781 |
| 12,189,441 B2* | 1/2025 | Ramakrishnan | H01L 23/481 |
| 2016/0128240 A1* | 5/2016 | Park | H05K 7/20927 |
| | | | 361/699 |
| 2016/0330873 A1* | 11/2016 | Farshchian | H05K 7/20663 |
| 2022/0007548 A1* | 1/2022 | Lee | H05K 7/20818 |
| 2022/0408587 A1* | 12/2022 | Kelley | H05K 7/20809 |
| 2023/0156961 A1* | 5/2023 | Yuan | H05K 7/203 |
| | | | 361/700 |

FOREIGN PATENT DOCUMENTS

| | | | | |
|---|---|---|---|---|
| CN | 107066056 A | | 8/2017 | |
| CN | 217183666 U | * | 8/2022 | H05K 7/203 |
| EP | 2665349 B1 | | 11/2013 | |

* cited by examiner

SERVER ASSEMBLY WITH CLOSED CONDENSING CIRCUIT AND COOLING APPARATUS CONTAINING THE SAME

BACKGROUND OF THE INVENTION

Field of Invention

The present invention relates to a cooling apparatus for a server assembly. More particularly, this present invention relates to a server assembly with a closed condensing circuit applied to a two-phase liquid immersion cooling apparatus that is capable of condensing all the coolant vapor therein more efficiently.

Description of the Related Art

With the advent of the data age, people are increasingly pursuing the pinnacle of science and technology and the ultimate in efficiency. A phase-change two-phase liquid immersion cooling system has been developed in recent years. The two-phase liquid immersion cooling system uses a non-conductive coolant to absorb a heat load of a server, and then transforms it to a coolant vapor, which is sequentially condensed to a liquid phase by a condensing device. In terms of thermal principles, an evaporative cooling is a process in which a heat load is removed by the latent heat of vaporization occurring when a non-conductive coolant absorbs heat and evaporates. Since the latent heat of vaporization of liquid is much larger than the specific heat of liquid, the evaporative cooling has a more significant effect on the cooling than the liquid cooling.

Nowadays, as far as the phase-change liquid immersion cooling technology is concerned, a condensing device is commonly positioned above the surface of a coolant in order to condense the vapor phase of the coolant to the liquid phase, which can be returned to a coolant-containing tank. However, when the coolant is vaporized into the coolant vapor by absorbing heat dissipated from servers, the rising coolant vapor will scatter in all directions, causing a portion of the coolant vapor to flow upward through the condensing device. Therefore, the condensing device cannot condense all the rising coolant vapor in the coolant-containing tank, which in turn causes the uncondensed coolant vapor to gradually accumulate and the pressure in the coolant-containing tank to rise accordingly. The internal temperature of the two-phase liquid immersion cooling system will rise eventually.

As for the aforementioned problem, the inventors of the present invention previously disclosed in the U.S. Pat. No. 11,357,137 B2 that a cooling apparatus is capable of cooling servers more efficiently by providing two condensing plates that are located above each of the servers. The two condensing plates are arranged in such a symmetrical and mutually inclined manner that most rising coolant vapor is efficiently condensed. However, in a process of routine maintenance of the servers, if many sets of the condensing plates are opened to remove servers, it will result in a large amount of the coolant vapor escaping through the condensing plates. Even though an external condenser is further disposed in the cooling apparatus, loss of some of the coolant vapor is unavoidable. Besides, the cooling apparatus is designed to have a space above the condensing plates, which is reserved as the space required for the removal of the servers. That increases the dimensions of the cooling apparatus and makes it a cumbersome apparatus to handle.

In view of this, in an attempt to ensure the functional reliability and cooling capacity of the two-phase liquid immersion cooling apparatus, it is necessary to develop a novel easy-to-handle cooling apparatus that can condense all the coolant vapor in the two-phase liquid immersion cooling system.

BRIEF SUMMARY OF THE INVENTION

It's an object of the present invention to provide a server assembly, particularly equipped with a closed condensing circuit. The disclosed server assembly includes an enclosed type condensing device configured for cooling a coolant vapor. During the operation of servers, a coolant is heated to a boiling point temperature by absorbing heat dissipated from the servers and then transformed into a coolant vapor, which rises from a surface level of the coolant. The closed condensing circuit can completely condense all the rising coolant vapor by preventing the rising coolant vapor from passing through the condensing device.

In order to attain the aforesaid object, according to one embodiment of the present invention, provided is a server assembly with a closed condensing circuit, which comprises a fluid-tight chassis, a server, and a condensing device. The chassis has an upper opening and accommodates a working fluid. The server is at least partially submerged within the working fluid.

The condensing device comprises a casing and a plurality of condensation pipes. The casing comprises a first framework and a second framework. The first framework is connected to the second framework to form a space. The casing has a lower opening. A fluid inlet circuit module and a fluid outlet circuit module are disposed respectively on both ends of the casing. The fluid inlet circuit module is provided with a plurality of holes penetrating an inward side thereof and a fluid inlet coupling disposed on a bottom side thereof. Similarly, the fluid outlet circuit module is provided with a plurality of holes penetrating an inward side thereof and a fluid outlet coupling disposed on a bottom side thereof.

The plurality of condensation pipes is disposed in the space of the casing. One end of each condensation pipe communicates with each corresponding hole of the fluid inlet circuit module. The other end of each condensation pipe communicates with each corresponding hole of the fluid outlet circuit module.

Moreover, the condensing device is disposed above and connected to the chassis. The lower opening of the condensing device communicates with the upper opening of the chassis to form a closed condensing circuit.

In one or more embodiments, wherein the working fluid is a non-conductive coolant.

In one or more embodiments, wherein the working fluid has a boiling point temperature ranging from 30° C. to 60° C.

In one or more embodiments, wherein the casing is provided with a lifting base.

In one or more embodiments, wherein a calibration plate is mounted on top sides of both ends of the casing, and one or more positioning marks are disposed on a surface of the calibration plate.

It's another object of the present invention to provide a two-phase liquid immersion cooling apparatus that is particularly applied to cool server assemblies equipped with closed condensing circuits. Each server assembly is independently disposed in the cooling apparatus. Not only can the cooling apparatus completely condense all the coolant vapor generated in the server assemblies, but it can also ensure functional reliability and cooling capacity during routine maintenance.

In order to attain the aforesaid object, according to one embodiment of the present invention, provided is a cooling apparatus for servers, which comprises a housing, a fluid inlet manifold, a fluid outlet manifold, and at least one independently operable server assembly with a closed condensing circuit.

The housing surrounds one or more independently operable server assemblies. The server assembly comprises a fluid-tight chassis, a server, and a condensing device. The chassis has an upper opening and accommodates a working fluid. The server is at least partially submerged within the working fluid.

The condensing device comprises a casing and a plurality of condensation pipes. The casing comprises a first framework and a second framework. The first framework is connected to the second framework to form a space. The casing has a lower opening. A fluid inlet circuit module and a fluid outlet circuit module are disposed respectively on both ends of the casing. The fluid inlet circuit module is provided with a plurality of holes penetrating an inward side thereof and a fluid inlet coupling disposed on a bottom side thereof. Similarly, the fluid outlet circuit module is provided with a plurality of holes penetrating an inward side thereof and a fluid outlet coupling disposed on a bottom side thereof.

The plurality of condensation pipes is disposed in the space of the casing. One end of each condensation pipe communicates with each corresponding hole of the fluid inlet circuit module. The other end of each condensation pipe communicates with each corresponding hole of the fluid outlet circuit module.

Moreover, the condensing device is disposed above and connected to the chassis. The lower opening of the condensing device communicates with the upper opening of the chassis to form a closed condensing circuit.

Furthermore, the fluid inlet manifold is configured for allowing condensation fluid to flow into the condensation pipes. The fluid inlet manifold is mounted on a first inner sidewall of the housing. The fluid inlet manifold is provided with a first number of a first fluid-directing coupling, wherein the first number is equal to or more than the number of the server assembly.

The fluid outlet manifold is configured for allowing condensation fluid to flow out from the condensation pipes. The fluid outlet manifold is mounted on a second inner sidewall of the housing. The fluid outlet manifold is provided with a second number of a second fluid-directing coupling, wherein the second number is equal to or more than the number of the server assembly.

The first fluid-directing coupling communicates with the fluid inlet coupling of the server assembly, and the second fluid-directing coupling communicates with the fluid outlet coupling of the server assembly.

In one or more embodiments, wherein the working fluid is a non-conductive coolant.

In one or more embodiments, wherein the working fluid has a boiling point temperature ranging from 30° C. to 60° C.

In one or more embodiments, wherein the casing is provided with a lifting base.

In one or more embodiments, wherein a calibration plate is mounted on top sides of both ends of the casing, and one or more positioning marks are disposed on a surface of the calibration plate.

As aforementioned, the present invention discloses a novel server assembly and a cooling apparatus. It should be noted that the server assembly is characteristic of having its own closed condensing circuit. Each server assembly is provided as a separate unit and functions independently. Besides, the cooling apparatus disclosed in the present is designed to have a special structure where the closed condensing circuit of the server assembly is connected to both a fluid inlet manifold and a fluid outlet manifold. The special structural arrangement allows a low-temperature condensation fluid to flow through each individual condensation pipe from the fluid inlet manifold, thereby maintaining the condensation pipes at a low temperature. Once the low-temperature condensation pipes are in contact with high-temperature coolant vapor, the coolant vapor is condensed into the coolant liquid by the heat exchange with the low-temperature condensation pipes. The heated condensation fluid exits from the condensing device into the fluid outlet manifold.

Specifically, when the coolant is being vaporized into the coolant vapor by absorbing heat dissipated from servers, the coolant vapor rises from the surface level of the coolant and then is condensed into the coolant liquid upon contact with or exposure to the enclosed condensing device located above the surface level of the coolant. All the rising coolant vapor is completely condensed instead of passing through the condensing device. Additionally, each server assembly is disposed individually in the cooling apparatus. Therefore, in a process of routine maintenance of the servers, a specifically chosen server assembly can be easily and conveniently removed from the cooling apparatus without affecting other server assemblies, thereby ensuring functional reliability and cooling capacity of the cooling apparatus during maintenance.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION OF THE INVENTION

Figure 1:
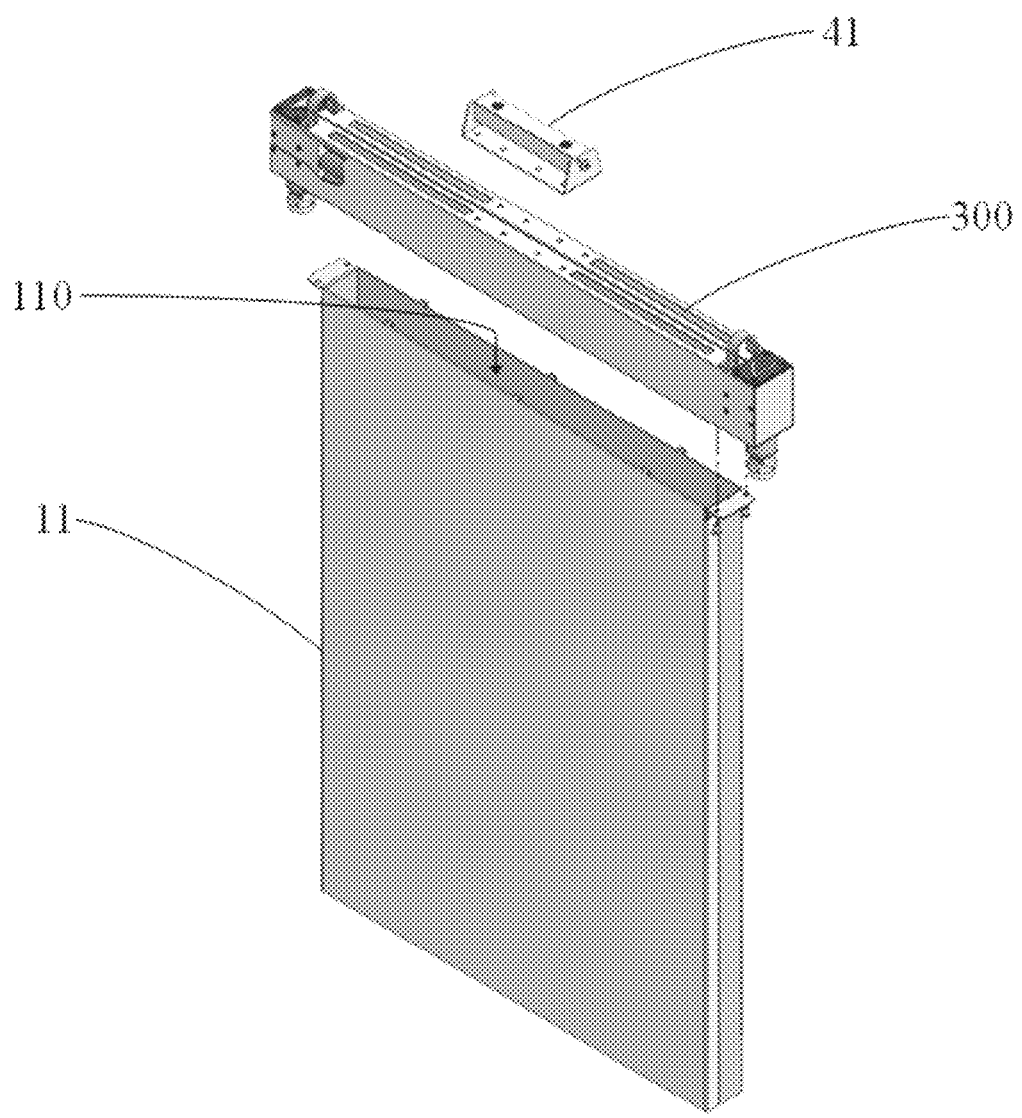
FIG. 1 is a perspective view of an example server assembly with a closed condensing circuit, according to one or more embodiments of the present invention.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures (e.g., FIGS. 4 and 6). In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Those of ordinary skill in the art will appreciate that the hardware components and basic configuration depicted in any of the figures illustrated by the drawings and described herein may vary. For example, the illustrative components within a condensing device (FIG. 2) and other devices and systems are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

It's an object of the present invention is to provide a server assembly with a closed condensing circuit, particularly applied in a two-phase liquid immersion cooling apparatus. The server assembly is specially designed to comprise a closed condensing circuit. During the operation of servers, a coolant is heated to a boiling point temperature by absorbing heat dissipated from the servers and then transformed into a coolant vapor, which rises from a surface level of the coolant. The rising coolant vapor can be totally retained within the enclosed condensing space, thereby preventing the rising coolant vapor from being left uncondensed and passing through the condensing device. In other words, the enclosed-type condensing circuit can completely condense all the rising coolant vapor.

Turning now to the figures, FIG. 1 illustrates a perspective view of an example server assembly with a closed condensing circuit. According to one embodiment of the present invention, provided is a server assembly 1000 with a closed condensing circuit. The server assembly 1000 comprises a fluid-tight chassis 11 and a condensing device 300 that is disposed above the chassis 11. The chassis 11 has an upper opening 110 and accommodates a server. The chassis 11 and the condensing device 300 are connected to each other as a whole. Preferably, the chassis 11 is detachably snapped to the condensing device 300. In a preferred embodiment of the present invention, the condensing device 300 is further provided with a lifting base 41 that is mounted on a top surface of the condensing device 300. The server assembly 1000 can be easily removed by lifting via the lifting base 41.

Figure 2:
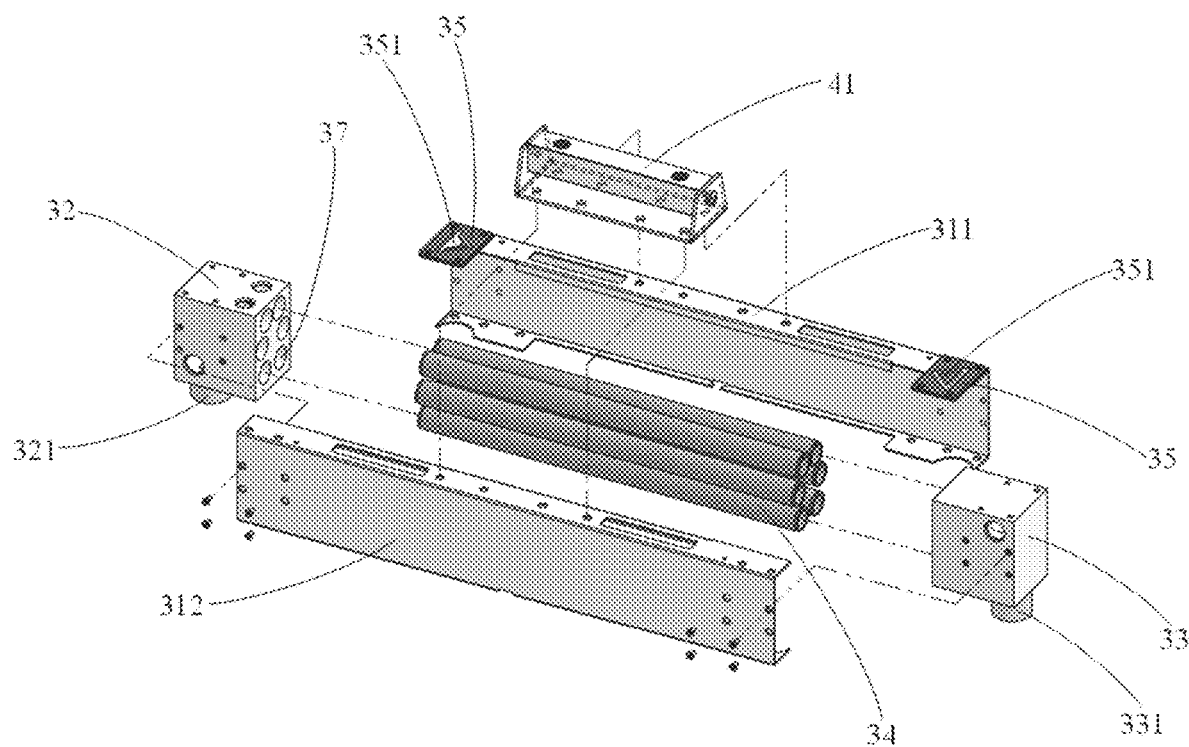
FIG. 2 is an exploded perspective view of an example condensing device, according to one or more embodiments of the present invention.
Figure 3:
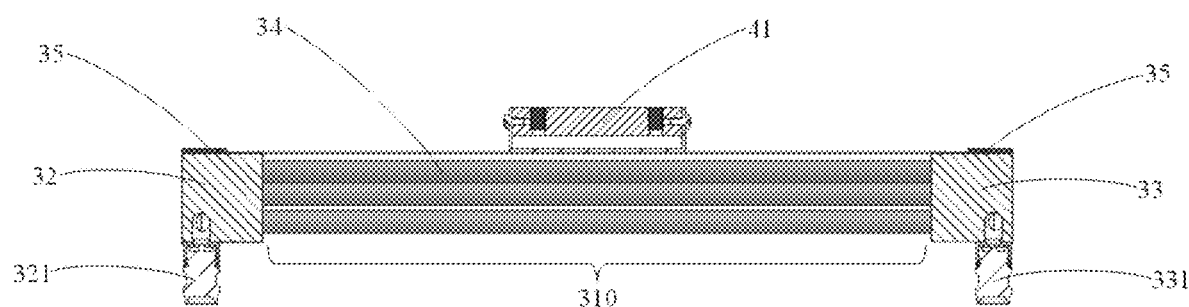
FIG. 3 is a front plan view of a longitudinal section through an example condensing device, according to one or more embodiments of the present invention.

References are now made to FIG. 2 and FIG. 3, which are an exploded perspective view and a front longitudinal sectional plan view of the condensing device, respectively. According to one embodiment of the present invention, the condensing device 300 comprises a casing and a plurality of condensation pipes. The casing comprises a first framework 311 and a second framework 312. The first framework 311 is connected to the second framework 312 to form a space. The plurality of condensation pipes 34 is disposed in the space. The casing has a lower opening 310 (as shown in FIG. 3). A fluid inlet circuit module 32 and a fluid outlet circuit module 33 are disposed respectively on both ends of the casing. The fluid inlet circuit module 32 is provided with a plurality of holes 37 penetrating an inward side thereof and a fluid inlet coupling 321 disposed on a bottom side thereof. Similarly, the fluid outlet circuit module 33 is provided with a plurality of holes (not shown in FIG. 2) penetrating an inward side thereof and a fluid outlet coupling 331 disposed on a bottom side thereof. Furthermore, one end of each condensation pipe 34 communicates with each corresponding hole 37 of the fluid inlet circuit module 32. The other end of each condensation pipe 34 communicates with each corresponding hole (not shown in FIG. 2) of the fluid outlet circuit module 33.

According to one embodiment of the present invention, the fluid inlet coupling 321 may be connected to any suitable condensation fluid supplying device, and the fluid outlet coupling 331 may be connected to any suitable condensation fluid draining device. Furthermore, the fluid inlet coupling 321 and the fluid outlet coupling 331 are preferably blindmate quick disconnect couplings. These couplings are used between removable condensing devices and fixed condensation fluid supplying or draining devices to allow for quick leak-free connection to and disconnection from the fluid flow-through systems. Therefore, the condensation fluid supplied by the condensation fluid supplying device can flow through the fluid inlet circuit module 32 into each condensation pipe 34, and then exit through the fluid outlet circuit module 33 into the condensation fluid draining device, which forms a condensing circuit.

Moreover, as can be seen in FIG. 1 and FIG. 3, the condensing device 300 is disposed above and connected to the chassis 11. The lower opening 310 of the condensing device 300 communicates with the upper opening 110 of the chassis 11 to form a "closed" condensing circuit.

According to another embodiment of the present invention, as shown in FIG. 2, a calibration plate 35 is mounted on top sides of both ends of the casing of the condensing device 300. One or more positioning marks 351 are disposed on a surface of the calibration plate 35. By means of a known robot positioning method, a robot has a control unit, and an optical sensing device is disposed on a front end of the robot. The optical sensing device has an optical sensing device coordinate system fixed thereon. The calibration plate has a calibration plate coordinate system fixed thereon. The optical sensing device captures a calibration plate image, and transmits the calibration plate image back to the control unit. Next, the control unit calculates a transformation matrix between the optical sensing device coordinate system and the calibration plate coordinate system, and an optical sensing device-calibration plate coordinate value. By doing so, the robot can precisely locate any individual server assembly and then remove it by a lifting base fixed on the server assembly.

Figure 4:
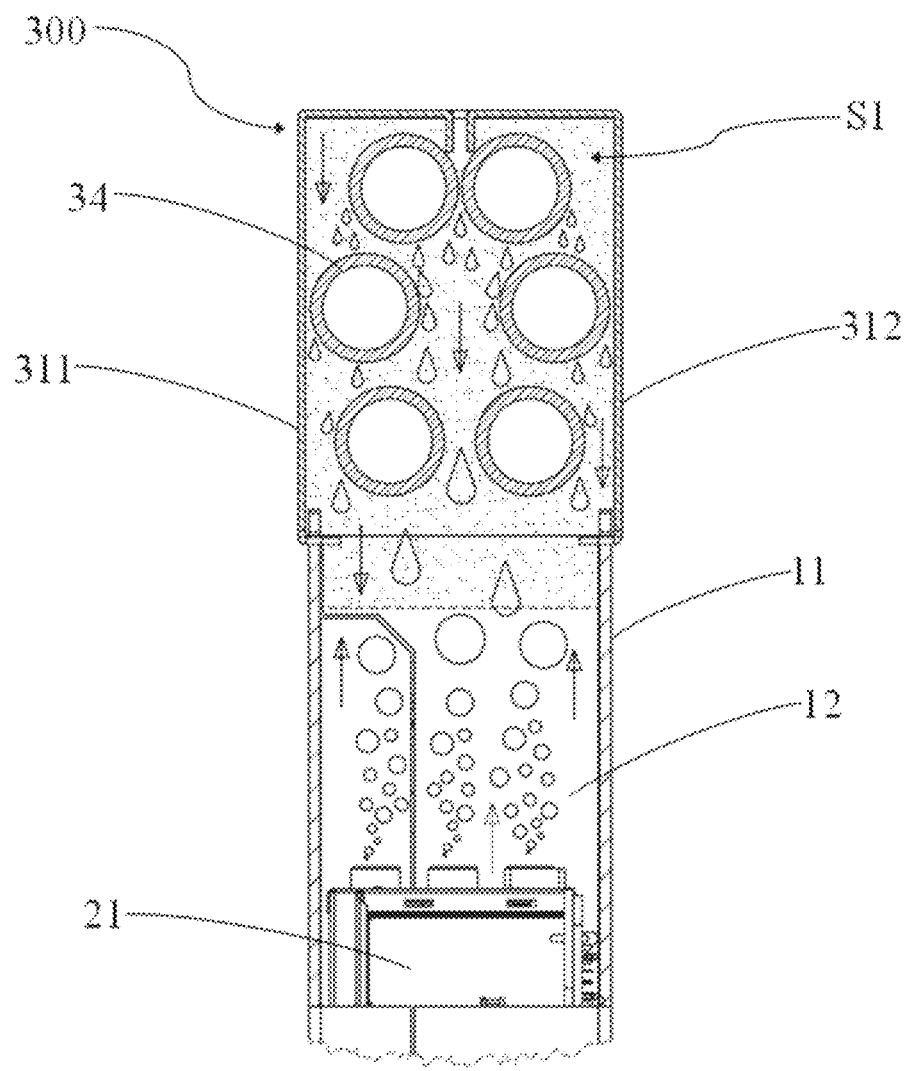
FIG. 4 is a partial side plan view of a longitudinal section through an example server assembly with a closed condensing circuit, according to one or more embodiments of the present invention.

Next, turning now to FIG. 4, there is presented a partial side plan view of a longitudinal section through the server assembly with a closed condensing circuit. The condensing device 300 is disposed above and communicates with the chassis 11. The first framework 311 is connected to the second framework 312 to form a space S1 of the condensing device 300. The plurality of condensation pipes 34 is disposed in the space S1. A working fluid 12 is maintained within the chassis 11. A server 21 is at least partially submerged within the working fluid 12.

In one embodiment of the present invention, the working fluid 12 is a coolant. The server 21 is entirely immersed within the coolant; that is, the server 21 always remains completely immersed within the coolant during the condensation cycle in which the coolant is vaporized into a coolant vapor by absorbing heat dissipated from the server and the coolant vapor is condensed back into the coolant upon contact with the condensing device.

It is understood that the coolant is a non-conductive coolant, which is known to ordinary people skilled in the art to which the present invention pertains. Using the non-conductive coolant to cool servers can simplify the sealing structure of a cooling apparatus, and can also prevent the malfunction of servers. In a preferred embodiment, the non-conductive coolant is fluoride, which has a boiling point temperature ranging between 30° C. and 60° C. With such a low boiling point, fluoride can absorb the heat dissipated from servers and reach to its boiling point temperature, resulting in vaporization of a portion of fluoride. The condensing device can condense the vapor-phase of fluoride, which can be returned to the container. Besides, all non-conductive coolants with a boiling point temperature ranging between 30° C. and 60° C. can be used as the coolants in the present invention.

References are now made to FIG. 3 and FIG. 4. As aforementioned, the condensing device 300 is disposed above and communicates with the chassis 11 to form a closed condensing circuit. As can be seen in FIG. 3, when the condensing device 300 is starting to condense a coolant vapor, a condensation fluid such as cold water flows through the fluid inlet circuit module 32 into each condensation pipe 34. Cold water can maintain the condensation pipes at a low temperature. Moreover, as shown in FIG. 4, when a working fluid 12 is being vaporized into a coolant vapor by absorbing heat dissipated from a server 21, the coolant vapor rises from the surface level of the coolant. Once the low-temperature condensation pipes 34 are in contact with high-temperature coolant vapor, the coolant vapor is condensed into a coolant liquid by the heat exchange with the condensation pipes. The coolant liquid falls back in the working fluid 12 due to relative density and operation of gravity. Finally, the heated condensation fluid exits the condensation pipes 34 through the fluid outlet circuit module 33 to complete the condensation cycle. In the closed condensing circuit, all the rising coolant vapor is completely condensed instead of passing through the condensing device.

It's another object of the present invention to provide a two-phase liquid immersion cooling apparatus that is particularly applied to cool server assemblies equipped with closed condensing circuits. Each server assembly is independently disposed in the cooling apparatus. Not only can the cooling apparatus completely condense all the coolant vapor generated in the server assemblies, but it can also ensure functional reliability and cooling capacity during routine maintenance.

Figure 5:
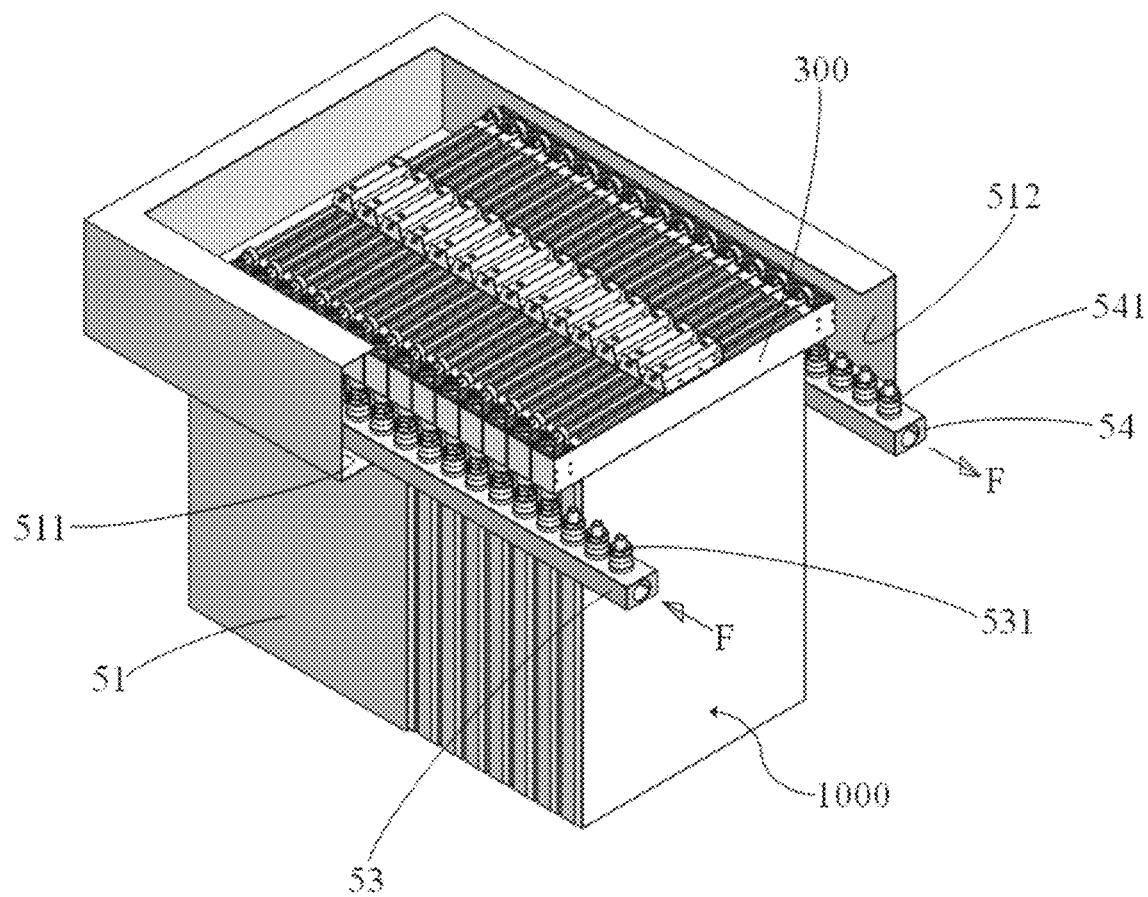
FIG. 5 is a schematic perspective view of an example two-phase liquid immersion cooling apparatus for servers, according to one or more embodiments of the present invention.

Turning now to FIG. 5, there is presented a schematic perspective view of a two-phase liquid immersion cooling apparatus for servers. According to one embodiment of the present invention, provided is a two-phase liquid immersion cooling apparatus for servers 5000, which comprises a housing 51, a fluid inlet manifold 53, a fluid outlet manifold 54, and at least one independently operable server assembly 1000 with a closed condensing circuit. Technical features of the server assembly with a closed condensing circuit are described in detail as above. It should be noted that in this embodiment, the server assembly is characteristic of having its own closed condensing circuit. Therefore, each server assembly is provided as a separate unit and functions independently.

According to one embodiment of the present invention, the fluid inlet manifold 53 is mounted on a first inner sidewall 511 of the housing 51. The fluid inlet manifold 53 is provided with a first number of a first fluid-directing coupling 531, wherein the first number is equal to or more than the number of the server assembly 1000. The first fluid-directing couplings 531 are disposed at a fixed distance apart from one another on a top wall of the fluid inlet manifold 53. The fluid outlet manifold 54 is mounted on a second inner sidewall 512 of the housing 51. The fluid outlet manifold 54 is provided with a second number of a second fluid-directing coupling 541, wherein the second number is equal to or more than the number of the server assembly 1000. The second fluid-directing couplings 541 are disposed at a fixed distance apart from one another on a top wall of the fluid outlet manifold 54. Furthermore, one end of the condensing device 300 is connected to the first fluid-directing coupling 531, and the other end of the condensing device 300 is connected to the second fluid-directing coupling 541.

As shown in FIG. 5, the flow route of condensation fluid F is where the condensation fluid flows from each first fluid-directing coupling 531 of the fluid inlet manifold 53 separately through each condensing device 300 of the server assembly 1000, and then flows out of the fluid outlet manifold 54 via the second fluid-directing couplings 541.

Figure 6:
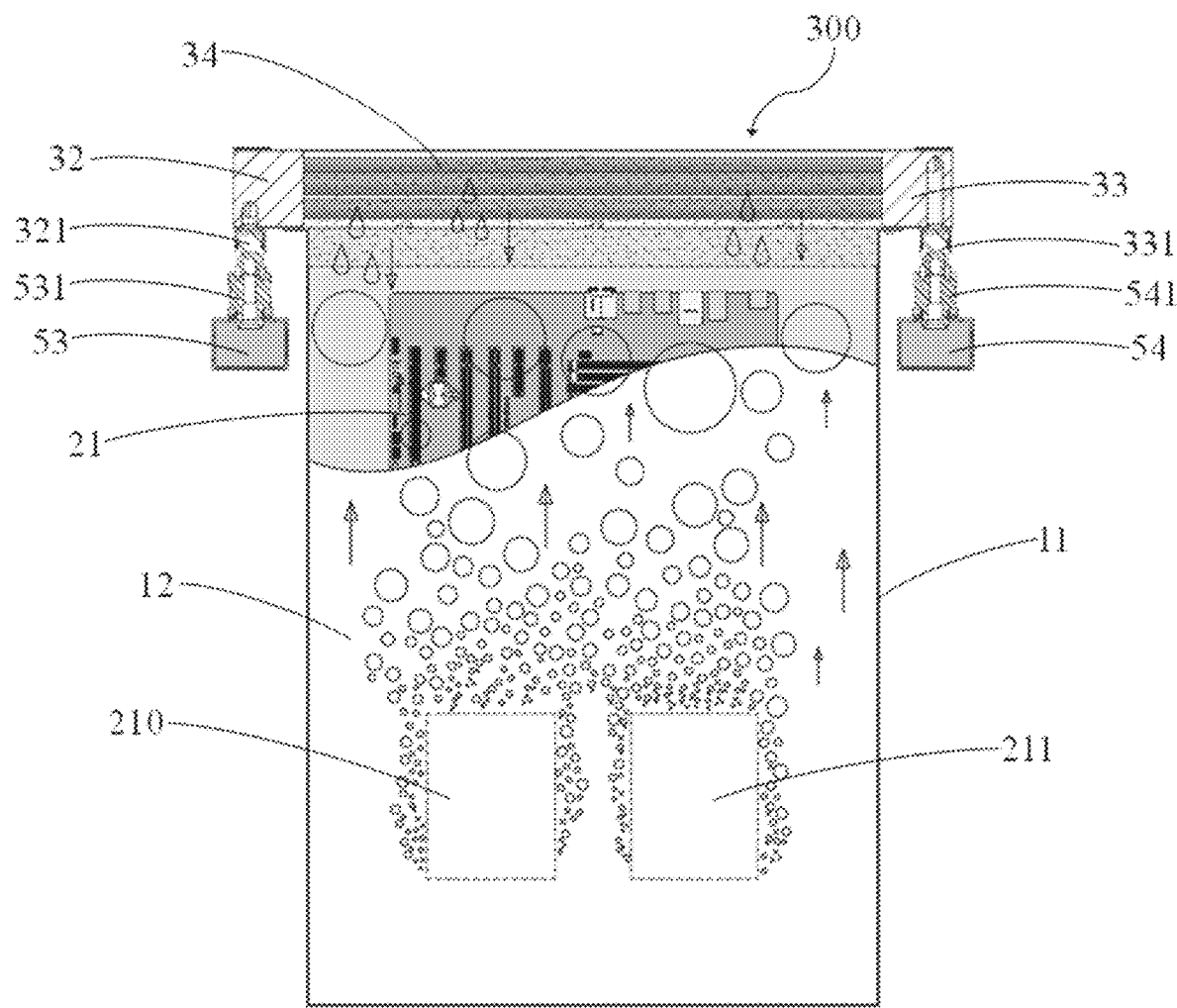
FIG. 6 is a front plan view of a longitudinal section through an example two-phase liquid immersion cooling apparatus, according to one or more embodiments of the present invention.

Next, in order to further describe the special structural design of the two-phase liquid immersion cooling apparatus for servers, reference is now made to FIG. 6, there is presented a front plan view of a longitudinal section through the two-phase liquid immersion cooling apparatus. According to one embodiment of the present invention, the condensing device 300 is disposed above and communicates with the chassis 11 to form an enclosed condensation space. A working fluid 12 is maintained within the chassis 11. A server 21 is at least partially submerged within the working fluid 12.

In one embodiment of the present invention, the working fluid 12 is a coolant. The server 21 is entirely immersed within the coolant; that is, the server 21 always remains completely immersed within the coolant during the condensation cycle in which the coolant is vaporized into a coolant vapor by absorbing heat dissipated from the server and the coolant vapor is condensed back into the coolant upon contact with the condensing device.

It is understood that the coolant is a non-conductive coolant, which is known to ordinary people skilled in the art to which the present invention pertains. Using the non-conductive coolant to cool servers can simplify the sealing structure of a cooling apparatus, and can also prevent the malfunction of servers. In a preferred embodiment, the non-conductive coolant is fluoride, which has a boiling point temperature ranging between 30° C. and 60° C. With such a low boiling point, fluoride can absorb the heat dissipated from servers and reach to its boiling point temperature, resulting in vaporization of a portion of fluoride. The condensing device can condense the vapor-phase of fluoride, which can be returned to the container. Besides, all non-conductive coolants with a boiling point temperature ranging between 30° C. and 60° C. can be used as the coolants in the present invention.

As shown in FIG. 6, the first fluid-directing coupling 531 communicates with the fluid inlet coupling 321 of the condensing device 300, and the second fluid-directing coupling 541 communicates with the fluid outlet coupling 331 of the condensing device 300. Specifically, the first fluid-directing coupling 531 is configured for guiding condensation fluid flowing from the fluid inlet manifold 53 into the condensing device 300, and the second fluid-directing coupling 541 is configured for guiding condensation fluid flowing from the condensing device 300 into the fluid outlet manifold 54. It's worth noting that the fluid inlet coupling 321, the fluid outlet coupling 331, the first fluid-directing coupling 531, and the second fluid-directing coupling 541 are preferably blind-mate quick disconnect couplings. These couplings are used between removable condensing devices and fixed manifolds to allow for quick leak-free connection to and disconnection from the fluid flow-through systems. Therefore, the first fluid-directing coupling 531 can be connected to or disconnected from the fluid inlet coupling 321 in a quick leak-free manner. Similarly, the second fluid-directing coupling 541 can be connected to or disconnected from the fluid outlet coupling 331 in a quick leak-free manner.

When the condensing device 300 is starting to condense a coolant vapor, a condensation fluid such as cold water flows from the fluid inlet manifold 53 through the fluid inlet circuit module 32 into each condensation pipe 34. Cold water can maintain the condensation pipes at a low temperature. Moreover, when a working fluid 12 is being vaporized into a coolant vapor by absorbing heat dissipated from heat-generating components 210, 211 of a server 21, the coolant vapor rises from the surface level of the coolant. Once the high-temperature coolant vapor is in contact with the low-temperature condensation pipes 34, it is condensed into a coolant liquid by the heat exchange with the condensation pipes. The coolant liquid falls back in the working fluid 12 due to relative density and operation of gravity. Finally, the heated condensation fluid flows through the fluid outlet circuit module 33 into the fluid outlet manifold 54 and then exits the condensation pipes 34 to complete the condensation cycle. In the closed condensing circuit, all the rising coolant vapor is completely condensed instead of passing through the condensing device.

Figure 7:
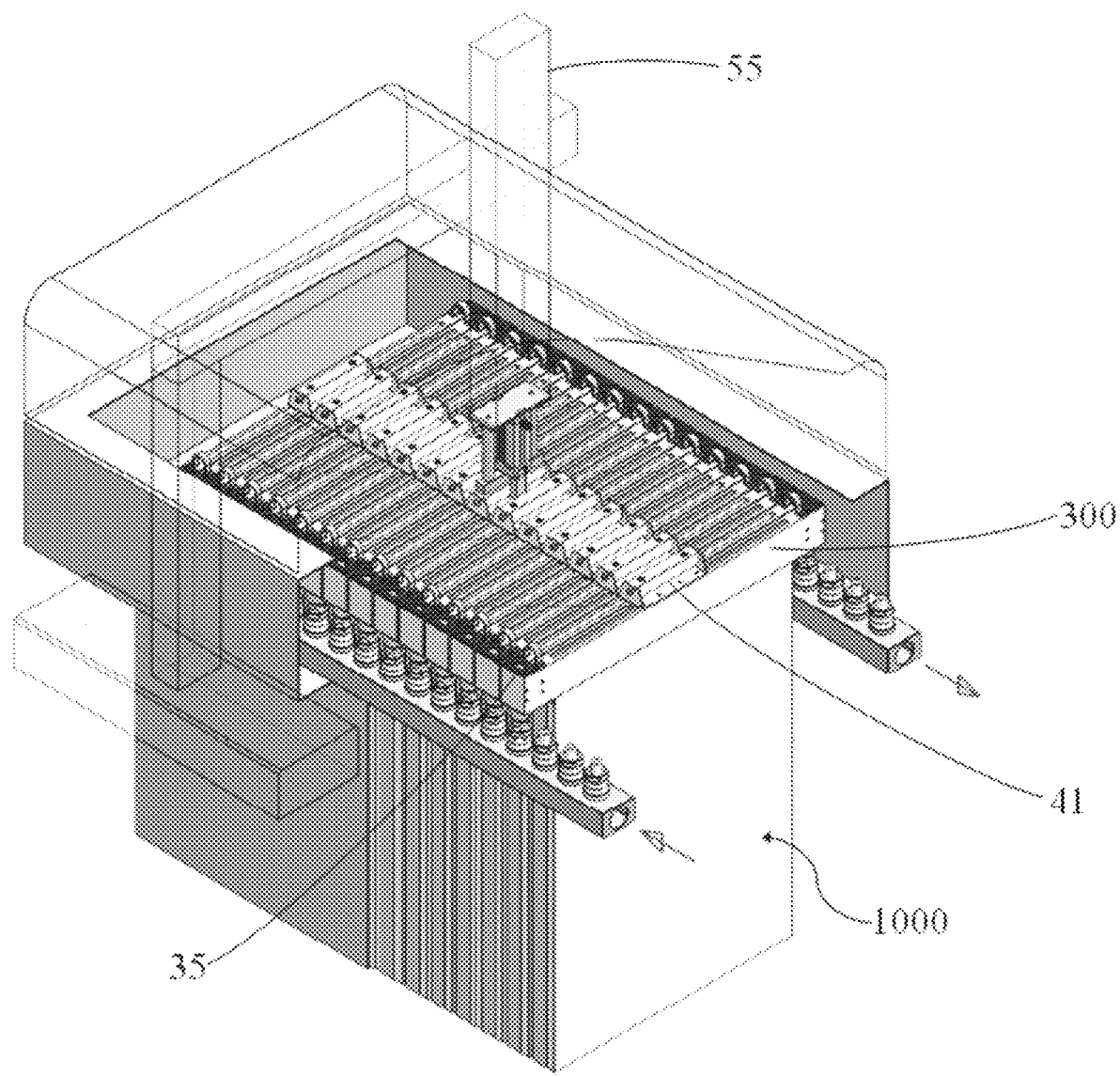
FIG. 7 is a schematic perspective view illustrating how to perform the repair of servers in an example two-phase liquid immersion cooling apparatus, according to one or more embodiments of the present invention.

Next, turning now to FIG. 7, there is presented a schematic perspective view illustrating how to perform the repair of server assemblies in a two-phase liquid immersion cooling apparatus. According to one embodiment of the present invention, as aforementioned, a calibration plate 35 is mounted on top sides of both ends of the casing of the condensing device 300. One or more positioning marks are disposed on a surface of the calibration plate 35. By means of a known robot positioning method, a robot has a control unit, and an optical sensing device is disposed on a front end of the robot. The optical sensing device has an optical sensing device coordinate system fixed thereon. The calibration plate has a calibration plate coordinate system fixed thereon. The optical sensing device captures a calibration plate image, and transmits the calibration plate image back to the control unit. Next, the control unit calculates a transformation matrix between the optical sensing device coordinate system and the calibration plate coordinate system, and an optical sensing device-calibration plate coordinate value. By doing so, in the process of routine maintenance or emergency repair, the robot 55 can precisely locate any individual server assembly 1000 by detecting the position of the calibration plate 35 and then automatically remove the server assembly 1000 by gripping a lifting base 41 fixed on the condensing device 300. Each server assembly is provided as a separate unit and functions independently in the cooling apparatus. Therefore, during repair or maintenance, a specifically chosen server assembly can be easily and conveniently removed from the cooling apparatus without affecting the operation of other server assemblies. Additionally, each server assembly is characteristic of having its own closed condensing circuit. Thus, the cooling apparatus disclosed in the present invention is designed to allow for simultaneous removal of several server assemblies without the loss of coolant vapor during repair or maintenance, thereby ensuring functional reliability and cooling capacity of the cooling apparatus.

Based on the foregoing disclosure of technical features, the present invention has the following advantages compared with the prior art:
1. The server assembly disclosed herein is provided as a separate unit that is equipped with its own closed condensing circuit, thereby completely condensing all the coolant vapor; and
2. The two-phase liquid immersion cooling apparatus disclosed herein is designed to accommodate multiple independently functioning server assemblies that have calibration plates. Therefore, in the process of repair or maintenance, one or more specifically chosen server assemblies can be automatically removed from the cooling apparatus by a robot without affecting the operation of other server assemblies.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:
1. A server assembly with a closed condensing circuit, comprising:
   a fluid-tight chassis within which a working fluid is maintained, the chassis having an upper opening;
   a server at least partially submerged within the working fluid; and
   a condensing device, comprising:
      a casing comprising a first framework and a second framework, the first framework being connected to the second framework to form a space, the casing having a lower opening, a fluid inlet circuit module and a fluid outlet circuit module being disposed respectively on both ends of the casing, the fluid inlet circuit module being provided with a plurality of holes penetrating an inward side thereof and a fluid inlet coupling disposed on a bottom side thereof, the fluid outlet circuit module being provided with a plurality of holes penetrating an inward side thereof and a fluid outlet coupling disposed on a bottom side thereof; and
      a plurality of condensation pipes disposed in the space, one end of each condensation pipe communicating with each corresponding hole of the fluid inlet circuit module, the other end of each condensation pipe communicating with each corresponding hole of the fluid outlet circuit module;
   wherein the condensing device is disposed above and connected to the chassis, and the lower opening of the casing of the condensing device communicates with the upper opening of the chassis to form the closed condensing circuit.

2. The server assembly with a closed condensing circuit of claim 1, wherein the working fluid is a non-conductive coolant.

3. The server assembly with a closed condensing circuit of claim 1, wherein the working fluid has a boiling point temperature ranging from 30° C. to 60° C.

4. The server assembly with a closed condensing circuit of claim 1, wherein the casing is provided with a lifting base.

5. The server assembly with a closed condensing circuit of claim 4, wherein a calibration plate is mounted on top sides of both ends of the casing, and one or more positioning marks are disposed on a surface of the calibration plate.

6. A two-phase liquid immersion cooling apparatus for servers, comprising:
   a housing surrounding at least one independently operable server assembly with a closed condensing circuit as recited in claim 1;
   a fluid inlet manifold configured for allowing condensation fluid to flow into the condensation pipes, the fluid inlet manifold being mounted on a first inner sidewall of the housing, the fluid inlet manifold being provided with a first number of the first fluid-directing couplings, wherein the first number is equal to or more than the number of the server assemblies; and
   a fluid outlet manifold configured for allowing condensation fluid to flow out from the condensation pipes, the fluid outlet manifold being mounted on a second inner sidewall of the housing, the fluid outlet manifold being provided with a second number of the second fluid-directing couplings, wherein the second number is equal to or more than the number of the server assemblies;
   wherein the first fluid-directing couplings communicate with the fluid inlet couplings of the server assemblies, and the second fluid-directing couplings communicate with the fluid outlet couplings of the server assemblies.

7. The two-phase liquid immersion cooling apparatus for servers of claim 6, wherein the working fluid is a non-conductive coolant.

8. The two-phase liquid immersion cooling apparatus for servers of claim 6, wherein the working fluid has a boiling point temperature ranging from 30° C. to 60° C.

9. The two-phase liquid immersion cooling apparatus for servers of claim 6, wherein the casing is provided with a lifting base.

10. The two-phase liquid immersion cooling apparatus for servers of claim 9, wherein a calibration plate is mounted on top sides of both ends of the casing, and one or more positioning marks are disposed on a surface of the calibration plate.

* * * * *